United States Patent [19]
Shinozaki

[11] Patent Number: 6,166,973
[45] Date of Patent: Dec. 26, 2000

[54] MEMORY DEVICE WITH MULTIPLE-BIT DATA PRE-FETCH FUNCTION

[75] Inventor: Naoharu Shinozaki, Kawasaki, Japan

[73] Assignee: Fujitsu, Limited, Kawasaki, Japan

[21] Appl. No.: 09/365,508

[22] Filed: Aug. 2, 1999

[30] Foreign Application Priority Data

Aug. 4, 1998 [JP] Japan .................................. 10-219987

[51] Int. Cl.[7] .................................................. G11C 7/00
[52] U.S. Cl. ........................... 365/200; 365/233; 365/194
[58] Field of Search .................................... 365/200, 233, 365/194

[56] References Cited

U.S. PATENT DOCUMENTS 5,808,944 9/1998 Yoshitake et al. ....................... 365/200
5,907,515 5/1999 Hatakeyama ............................ 365/200

*Primary Examiner*—Huan Hoang
*Attorney, Agent, or Firm*—Arent, Fox, Kintner, Plotkin & Kahn, PLLC

[57] ABSTRACT

The present invention is a memory device having a multiple-bit data pre-fetch function wherein the operation of a redundancy checking circuit for comparing addresses and redundant addresses and checking the coincidence or non-coincidence thereof is started with timing prior to performing the last data fetches. The address signals are supplied with the same timing as the supply of the write commands, wherefore it is not always necessary for the operation of comparing the address signals against the redundant addresses of the memory cells, where the switch to the redundant cell array was performed, to have to wait until all of the multiple-bit data to be fetched. Accordingly, with the present invention, the redundancy checking operation is started before all of the data are fetched. In the case of a 2-bit data pre-fetch, the redundancy checking operation is started after the first datum has been fetched, and before the second bit of data is fetched. That being so, it is possible to begin the decoder operation with timing that is faster by precisely the period of the redundancy checking operation, wherefore it becomes possible to perform write operations to the memory cells with faster timing.

14 Claims, 16 Drawing Sheets

6,166,973

MEMORY DEVICE WITH MULTIPLE-BIT DATA PRE-FETCH FUNCTION

BACKGROUND OF THE INVENTION

1. Field of the Invention

This invention relates to a memory device having a data pre-fetch function for continuously fetching a plurality of data, for one supplied address, and writing those data simultaneously to internal memory cells, and particularly to a memory device capable of making write operations faster.

2. Description of the Related Art

Clock-synchronized memory devices such as SDRAMs fetch data and addresses, output data, and perform internal operations in synchronization with a clock signal. The DDR-SDRAM (double data rate synchronous DRAM) has been proposed for making such SDRAM operations even faster. The DDR-SDRAM, more specifically, performs the operations mentioned above synchronized with both the rising edge and the falling edge of the clock signal.

Meanwhile, in memory devices, multiple bit data pre-fetch functions are provided for performing read and write operations on a plurality of data internally for one address. Accordingly, in the write mode of such a DDR-SDRAM, a write command signal and address are fetched in synchronization with the rising edge of the clock signal, and then, in synchronization with the rising edge and the falling edge of the clock signal, a plurality of write data are fetched. Then, after all data have been fetched, the address decoder and write circuit begin operating.

In FIG. 16 is given a circuit configuration diagram of a column system in a conventional memory device. In FIG. 17 is given a timing chart wherein are indicated problem points in a conventional write mode. In FIG. 16 there is an address buffer 10 that fetches addresses A0–A13, a delay circuit 44 for delaying those addresses, a redundancy checking circuit 46 for making comparisons with redundant addresses, and decoder circuits 48 and 50 for inputting and decoding redundancy checking signals and an address φ46. Also provided are an input buffer 24 for inputting data, delay circuits 25 and 27 for delaying those data, respectively, and a write amp 52 for amplifying the delayed data Data1 and Data2 and supplying them to data buses DB.

In the example in FIG. 16, the decoder circuitry includes an ordinary decoder circuit 48 and a redundancy decoder circuit 50. In the example in FIG. 16, moreover, a 2-bit data pre-fetch function is provided, and a memory cell array (not shown) is made up of an odd-numbered address side and an even-numbered address side. Accordingly, the decoder circuits 48 and 50 output an odd-side column selection signal $CL_O$ and an even-side column selection signal $CL_E$. Similarly, the write amp 52 supplies data for an odd-side data bus $DB_O$ and an even-side data bus $DB_E$, respectively.

As represented in the timing chart for the write mode in FIG. 17, a write-destination address Add1 is supplied simultaneously with the supply of a write command WR1 at the rising edge t0 of the clock signal. Then, in synchronization with the rising edge t2 of the clock signal after one clock period defined by a data latency=1, the first datum Data1 is supplied, and, in synchronization with the following clock signal falling edge t3, the second datum Data2 is supplied. At the clock signal falling edge t3 where the second bit of data is fetched, the redundancy checking operation RDD begins, and, following after that, the decoder operation DEC is started. From the point in time where the decoder operation DEC ends up until the time that the next redundancy checking operation RDD ends constitutes an address defining time $T_{WADD}$ for defining the address Add1 for the write command.

Also, the data Data1 and Data2 are amplified by the write amp 52 from the falling edge t3 of the clock signal where the last datum Data2 is supplied. That being so, from the point in time where this write amp 52 operation ends up until the end of the write amp 52 operation in the next cycle constitutes a data defining time $T_{WDA}$, and the status during that time interval is one wherein data are supplied on the data bus.

Therefore, in the example in FIG. 17, the time interval wherein the data defining time $T_{WDA}$ and the address defining time $T_{WADD}$ overlap becomes the write enabled time $T_{WEN}$. It is necessary for the column selection signal CL to be supplied during this time period, and a CL activating signal $\phi_{CL}$ that controls the timing of the generation of the column selection signal CL is generated within the write enabled time $T_{WEN}$. In order to effect the operational timing described above, the delay circuit 44 is provided in the address system, and the delay circuits 25 and 27 are provided in the data system. These delay circuits, respectively, are configured by flip-flops which operate in synchronization with the clock signal. More specifically, the rising edge of the clock signal constitutes timing where the clock signal phase is 0°, and the falling edge of the clock signal constitutes timing where the clock signal phase is 180°.

As described in the foregoing, when a 2-bit data pre-fetch function is provided, the write amp 52, which is a data-system circuit, cannot be operated until after all of the 2 bits of data have been fetched. Accordingly, the start of the write amp operation is at the falling edge t3 of the clock signal after 2 bits of data are fetched, after the clock cycle with the data latency (=1) from the supply of the write command WR1. Similarly, in conventional circuitry, the circuits in the address system also begin their operations from the falling edge t3 of the clock signal just as in the data system. That being so, the redundancy checking operation begins with a clock signal t3 timing, and the decoder operation is performed after that. As a result, the write enabled time $T_{WEN}$ does not come until after the clock signal time t4, whereupon substantially long time is consumed until write completion.

This kind of delay in the write timing is not compatible with implementing a double-rate clock scheme to achieve faster speeds, and further the impartation of a multiple-bit data pre-fetch function.

Furthermore, depending on the architecture of the memory device, the operating period of the redundancy checking circuit and the decoder operation sometimes becomes longer. When that is the case, it sometimes happens that the $T_{WEN}$, in the region where the address defining time $T_{WADD}$ and the data defining time $T_{WDA}$ overlap, becomes even narrower. In such cases, when the clock is run at higher speeds, it may be anticipated that it will become impossible to secure the write enabled time $T_{WEN}$ unless the timing of the start of operation in each circuit is optimized.

Thereupon, an object of the present invention is to provide a clock-synchronized memory device wherewith write operations can be made faster than in conventional examples.

Another object of the present invention is to provide a clock-synchronized memory device wherewith appropriate write operations can be performed with a high-frequency clock.

Yet another object of the present invention is to provide a clock-synchronized memory device wherewith write operations are fast and appropriate write operations can be performed, even with a high-frequency clock.

SUMMARY OF THE INVENTION

In order to achieve the objects stated above, the present invention is a memory device having a multiple-bit data pre-fetch function wherein the operation of a redundancy checking circuit for comparing addresses and redundant addresses and checking the coincidence or non-coincidence thereof is started with timing prior to performing the last data fetches. The address signals are supplied with the same timing as the supply of the write commands, wherefore it is not always necessary for the operation of comparing the address signals against the redundant addresses of the memory cells, where the switch to the redundant cell array was performed, to have to wait until all of the multiple-bit data to be fetched. Accordingly, with the present invention, the redundancy checking operation is started before all of the data are fetched. In the case of a 2-bit data pre-fetch, the redundancy checking operation is started after the first datum has been fetched, and before the second bit of data is fetched. That being so, it is possible to begin the decoder operation with timing that is faster by precisely the period of the redundancy checking operation, wherefore it becomes possible to perform write operations to the memory cells with faster timing.

In order to achieve the objects noted earlier, one aspect of the present invention is a memory device having a data pre-fetch function wherewith, for one address, a plurality of data is fetched in synchronization with a first and a second edge of a clock signal, and the plurality of data is written to memory cells via a write amp; comprising: an ordinary cell array and a redundant cell array both having memory cells; a redundancy checking circuit for comparing the addresses with redundant addresses and checking the coincidence or non-coincidence thereof; and a decoder circuit for decoding the addresses and for selecting memory cells either in the ordinary cell array or in the redundant cell array in response to the coincidence or non-coincidence determined by the redundancy checking circuit; wherein the redundancy checking circuit begins the redundancy checking operation before the write amp starts the operation.

In order to achieve the objects noted earlier, furthermore, the second aspect of the present invention is a memory device having a data pre-fetch function wherewith, for one address, first and second data are fetched in synchronization with the rising edge and the falling edge of a clock signal, respectively, and those first and second data are written to memory cells via a write amp; comprising: an ordinary cell array and a redundant cell array both having memory cells; a redundancy checking circuit for comparing the addresses with redundant addresses and checking the coincidence or non-coincidence thereof; and a decoder circuit for decoding the addresses and for selecting memory cells either in the ordinary cell array or in the redundant cell array in response to the coincidence or non-coincidence determined by the redundancy checking circuit; wherein the redundancy checking circuit begins the redundancy checking operation before the second datum is fetched.

DESCRIPTION OF THE PREFERRED EMBODIMENTS

Embodiment aspects of the present invention are now described, following the drawings. However, the technological scope of the present invention is not limited to or by these embodiment aspects.

Figure 1:
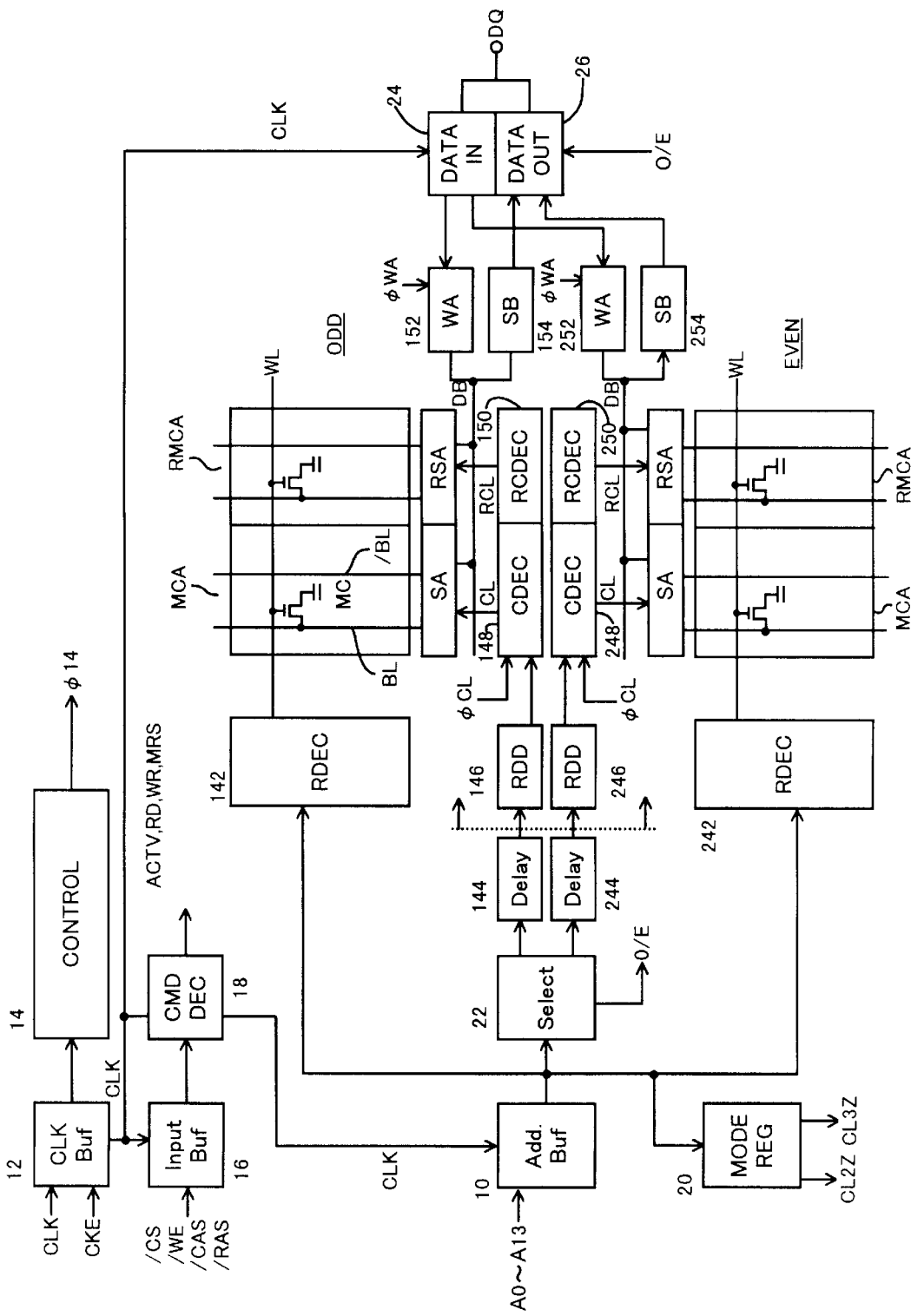
FIG. 1 is a simplified configuration diagram for a clock-synchronized memory device with 2-bit data pre-fetch function.

FIG. 1 is a simplified configuration diagram of a clock-synchronized memory device having a 2-bit data pre-fetch function. In FIG. 1, a clock signal CLK is brought in by a clock buffer 12 and an internal clock signal CLK is generated. In synchronization with this internal clock signal CLK, the addresses A0–A13 are fetched by an address buffer 10, and commands /CS, /WE, /CAS, and /RAS are fetched by an input buffer 16. In addition, a data input buffer 24 and data output buffer 26 connected to an I/O terminal DQ fetches data and output data, respectively, in synchronization with the internal clock signal CLK. Based on the clock signal CLK, a controller 14 supplies timing control signals $\phi_{14}$ to each circuit. The commands /CS, /WE, /CAS, and /RAS are supplied to a command decoder 18 and, in response to these commands, the internal command signals ACTV (active), RD (read), WR (write), and MRS (mode register set) are generated. When power to the memory device is turned on, various modes are set in a mode register 20 in accordance with data supplied to a certain address terminal.

The memory device comprises a part ODD corresponding to odd-numbered addresses, and a part EVEN corresponding to even-numbered addresses. Row addresses are supplied, via the address buffer 10, to a row decoder 142 on the odd-numbered side and to a row decoder 242 on the even-numbered side. The respective memory cell arrays MCA therefor each have a plurality of word lines WL and a plurality of bit lines BL and /BL. Adjacent to the ordinary memory cell arrays MCA are provided redundant cell arrays RMCA. And for each of these memory cell arrays are provided sense amps SA and RSA, respectively.

In the memory device diagrammed in FIG. 1, for the column addresses, column addresses corresponding to the odd-numbered side and the even-numbered side are generated by an address supply circuit 22 and supplied, respectively, to the column address system circuitry. On the odd-numbered side are provided a delay circuit 144, a redundancy checking circuit 146, a column decoder 148, and a redundant column decoder 150. On the even-numbered side, similarly, are provided a delay circuit 244, a redundancy checking circuit 246, a column decoder 248, and a redundant column decoder 250.

In the data system circuitry, a common data input buffer 24 and common data output buffer 26 are connected, respectively, to a write amp 152 on the odd-numbered side and a write amp 252 on the even-numbered side, and to a read amp (sense buffer) 154 on the odd-numbered side and a read amp (sense buffer) 254 on the even-numbered side. These amps are connected, respectively, to a data bus $DB_O$ on the odd-numbered side and to a data bus $DB_E$ on the even-numbered side, and perform amplification operations for writes to and reads from the memory cells.

With the configuration described above, for one supplied column address, two column addresses are supplied by the address supply circuit 22 internally, to the odd-numbered side and even-numbered side, respectively. As a result, in a read operation, two data are read out simultaneously, and two data are output continuously from the common data output buffer 26. In a write operation, similarly, two data are fetched from the common data input buffer 24, and simultaneously written to the memory cell arrays on the odd-numbered and even-numbered sides through the write amps 152, 252. The timing of this write operation is controlled by the CL activating signal $\phi_{CL}$ which controls the column selection signal CL supply.

Figure 2:
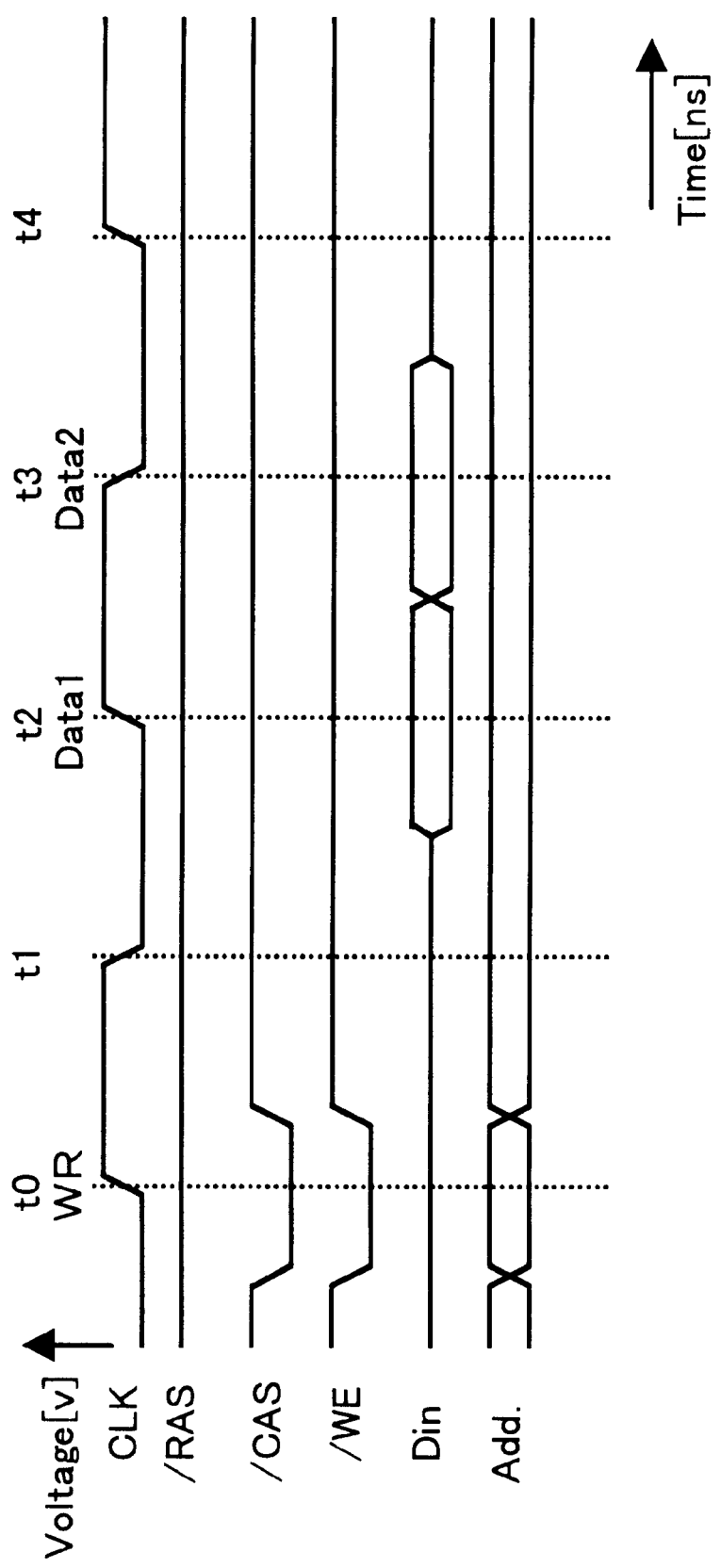
FIG. 2 is a timing chart representing in simplified form a write operation in the memory device of FIG. 1.

FIG. 2 is a timing chart that, in a simplified form, represents a write operation in the memory device diagrammed in FIG. 1. In FIG. 2, the actions occurring after the write command WR is supplied are diagrammed. In an ordinary memory device, an active command ACTV for controlling the row system operations is supplied simultaneously with the row address, and everything up to the word line drive and sense amp drive is performed. After that, for the commands which control the column system operations, a read command RD or write command WR is supplied simultaneously with the column address, and the operations of the circuitry in the column system are performed. Accordingly, in the timing chart in FIG. 2, what is represented are the operations from the supply of the write command WR, after the active command has been supplied and the row system operations have been completed.

As diagrammed in FIG. 2, in synchronization with the rising edge to of the clock signal CLK, both the write command WR and the column address are supplied. When the signal level combination for the command signals /RAS, /CAS, and /WE is H, L, L, the write command WR is connoted. Accordingly, the command decoder 18 in FIG. 1 decodes the combination of these command signals and detects the write command.

In the example in FIG. 2, the settings are such that write data are supplied after one clock signal CLK cycle period following the supply of the write command WR. In other words, in this example in FIG. 2, the data latency is set to 1. That being so, the initial datum Data1 is fetched in synchronization with the rising edge t2, one clock cycle period later than the rising edge t0. Moreover, because a double data rate (DDR) is in effect here, the second datum Data2 is fetched in synchronization with the next falling edge t3 of the clock signal CLK. As has been described already, in a conventional memory device, both the column system circuitry and the data system circuitry begin operating simultaneously, beginning at the falling edge t3 of the clock signal CLK when all data have been fetched.

(First Embodiment Aspect Example)

Figure 3:
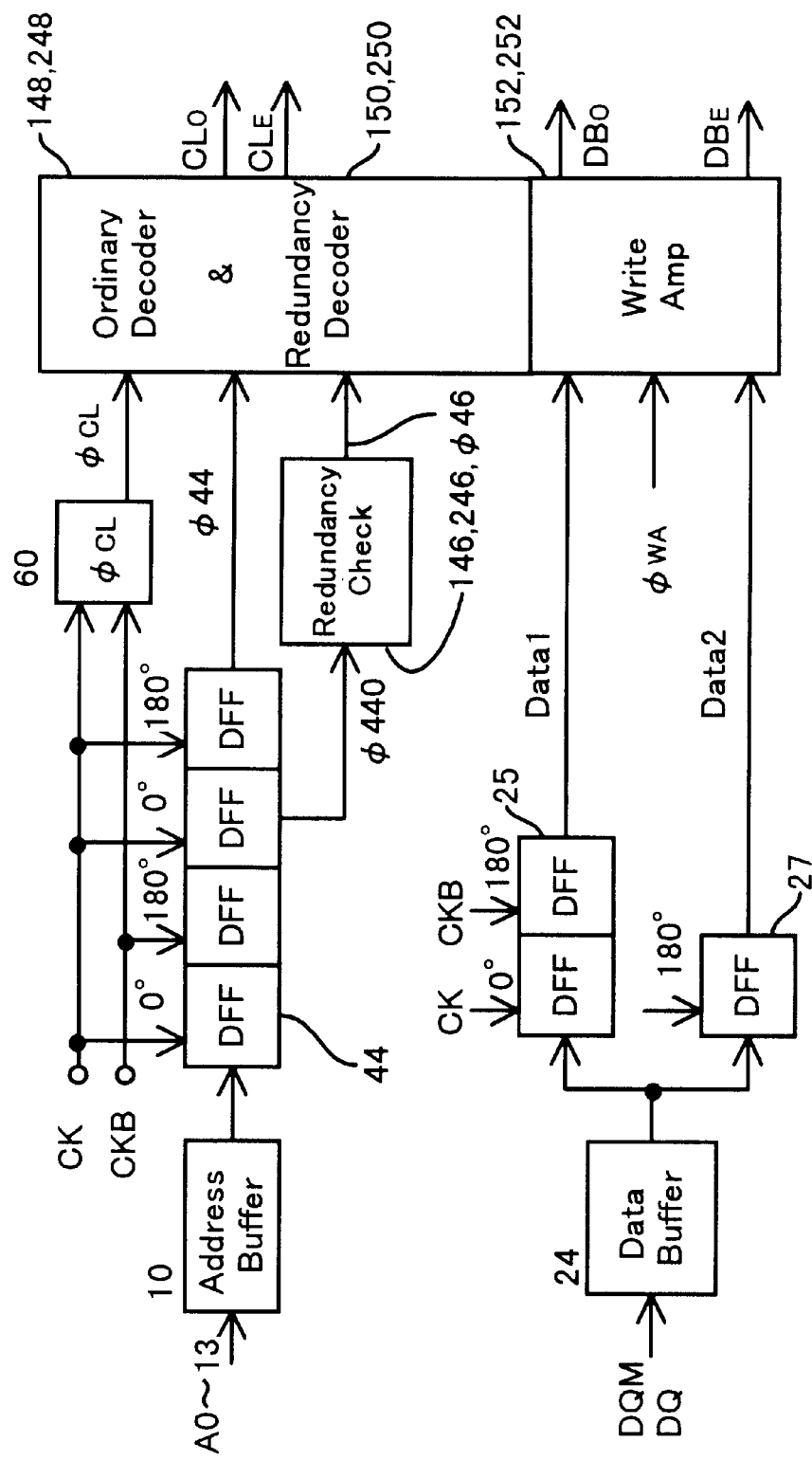
FIG. 3 is a configuration diagram for a memory device in a first embodiment aspect of the present invention.
Figure 16:
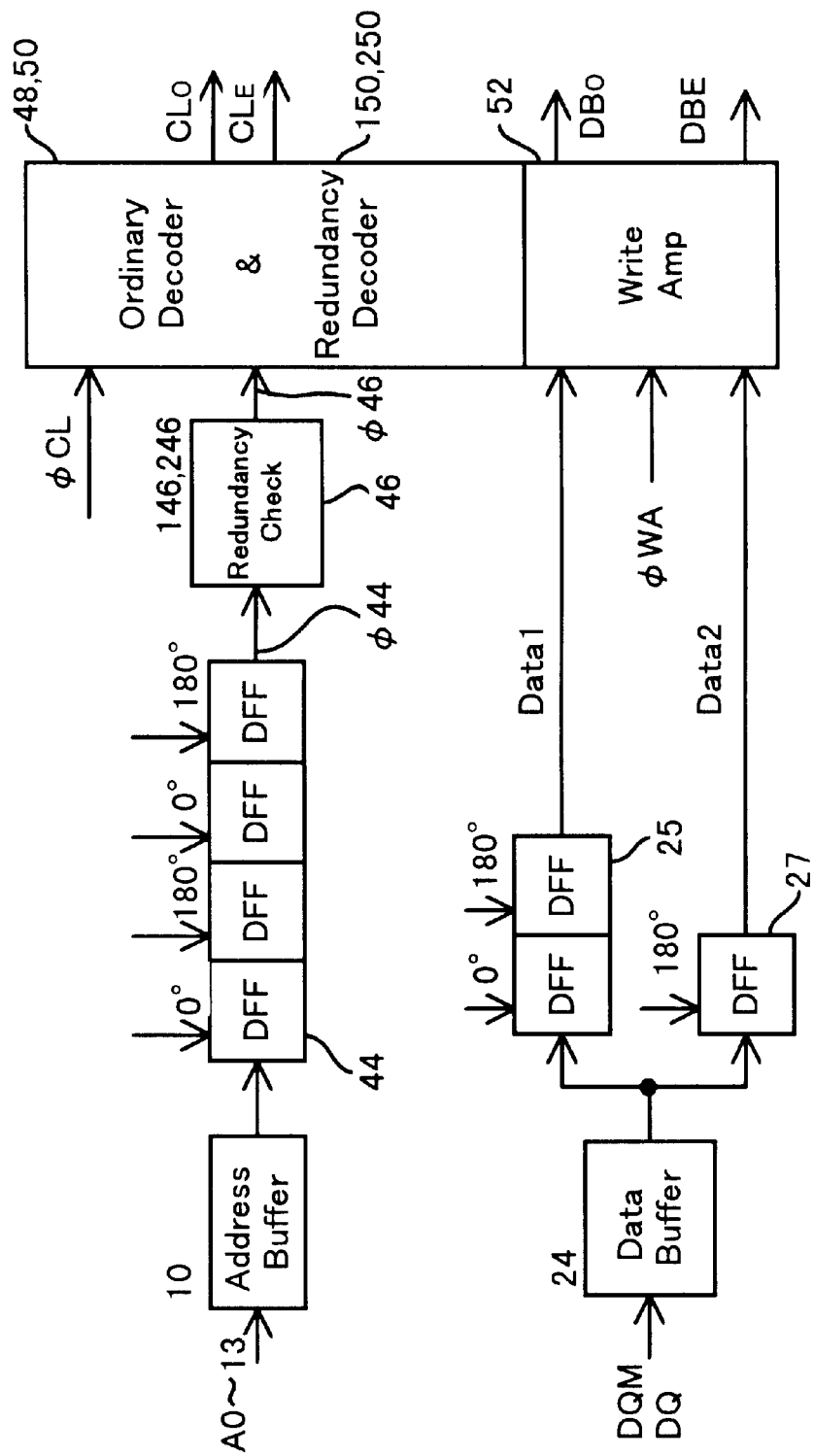
FIG. 16 is a configuration diagram of the column-system circuitry in a conventional memory device.

FIG. 3 is a configuration diagram for a memory device in a first embodiment aspect example of the present invention. The configuration of this first embodiment aspect example becomes clear when compared with the conventional example diagrammed in FIG. 16. In FIG. 3, the division between the odd-numbered side and the even-numbered side is omitted, but column addresses are fetched by an address buffer 10 and supplied to a delay circuit 44. As diagrammed here, the delay circuit 44 comprises a flip-flop that is controlled by a clock signal CK synchronized with the rising edge (0°) of the clock signal CLK, and a flip-flop that is controlled by a clock signal CKB synchronized with the falling edge (180°) thereof. In the conventional example, using the delay circuit 44 comprising these four flip-flop stages, the column address is delayed one clock cycle period and then supplied to the redundancy checking circuits 146 and 246 (cf. FIG. 16). Thereupon, in the first embodiment aspect example, the redundancy checking circuits 146 and 246 operate in response to the timing $\phi_{440}$ output by the third-stage flip-flop that operates with clock timing synchronized with the rising edge (0°). The decoder circuits 148, 248, 150, 250 begin its decoding operation with the timing of $\phi_{44}$ output by the fourth-stage flip-flop.

Data, meanwhile, are fetched by the data input buffer 24 and supplied to the delay circuits 25 and 27, respectively. The delay circuit 25 comprises a flip-flop controlled by the clock signal CK synchronized with the rising edge (0°) and a flip-flop controlled by the clock signal CKB synchronized with the falling edge (180°), and the fetched datum Data1 is supplied to the write amp 152 delayed one half clock cycle of the clock signal CLK. The second fetched datum Data2 is controlled by the clock signal CKB synchronized with the falling edge (180°) of the clock signal CLK, and supplied to the write amp 152 simultaneously with the datum Data1.

Figure 4:
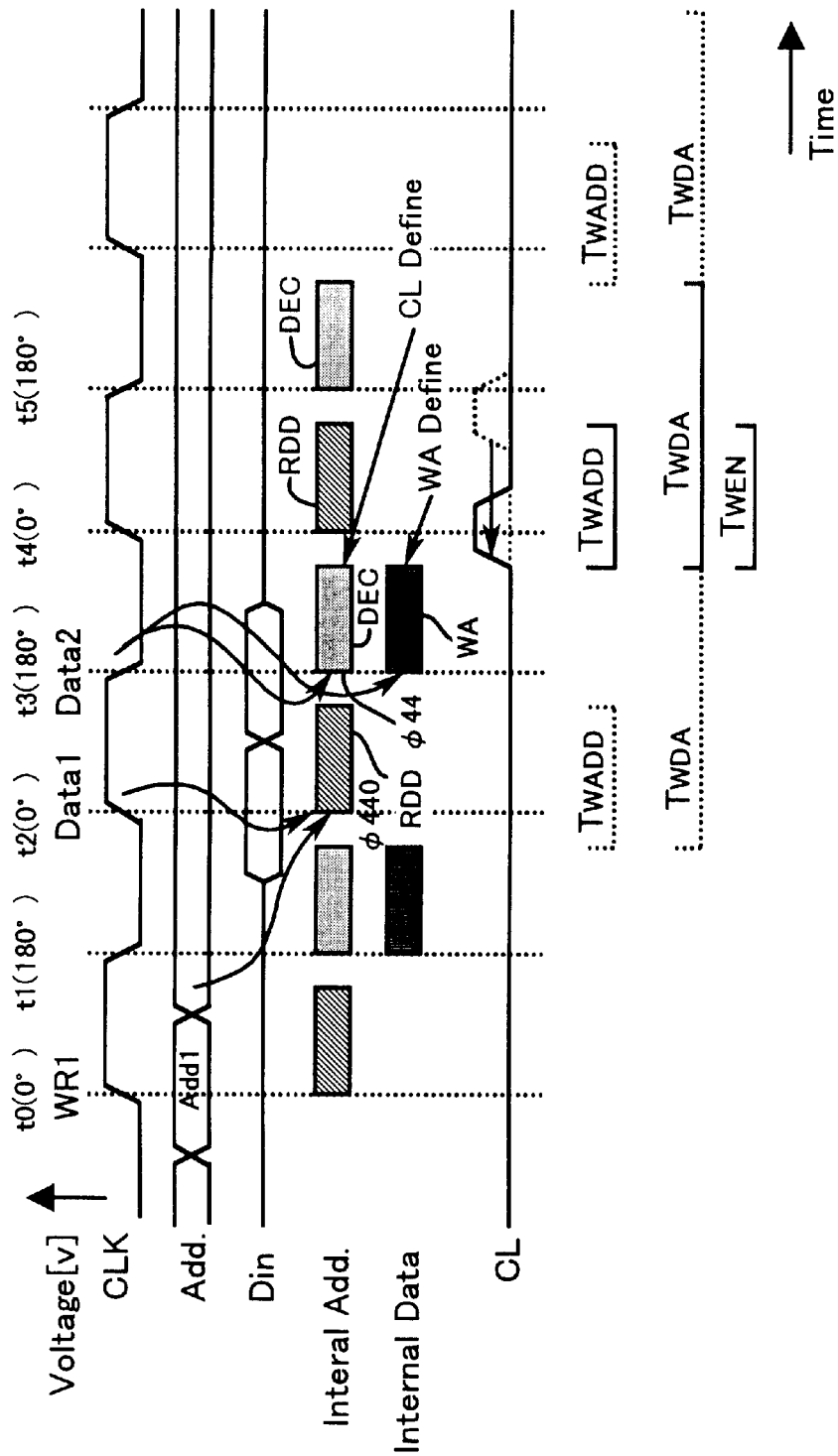
FIG. 4 is a timing chart representing the operation of the first embodiment aspect.
Figure 17:
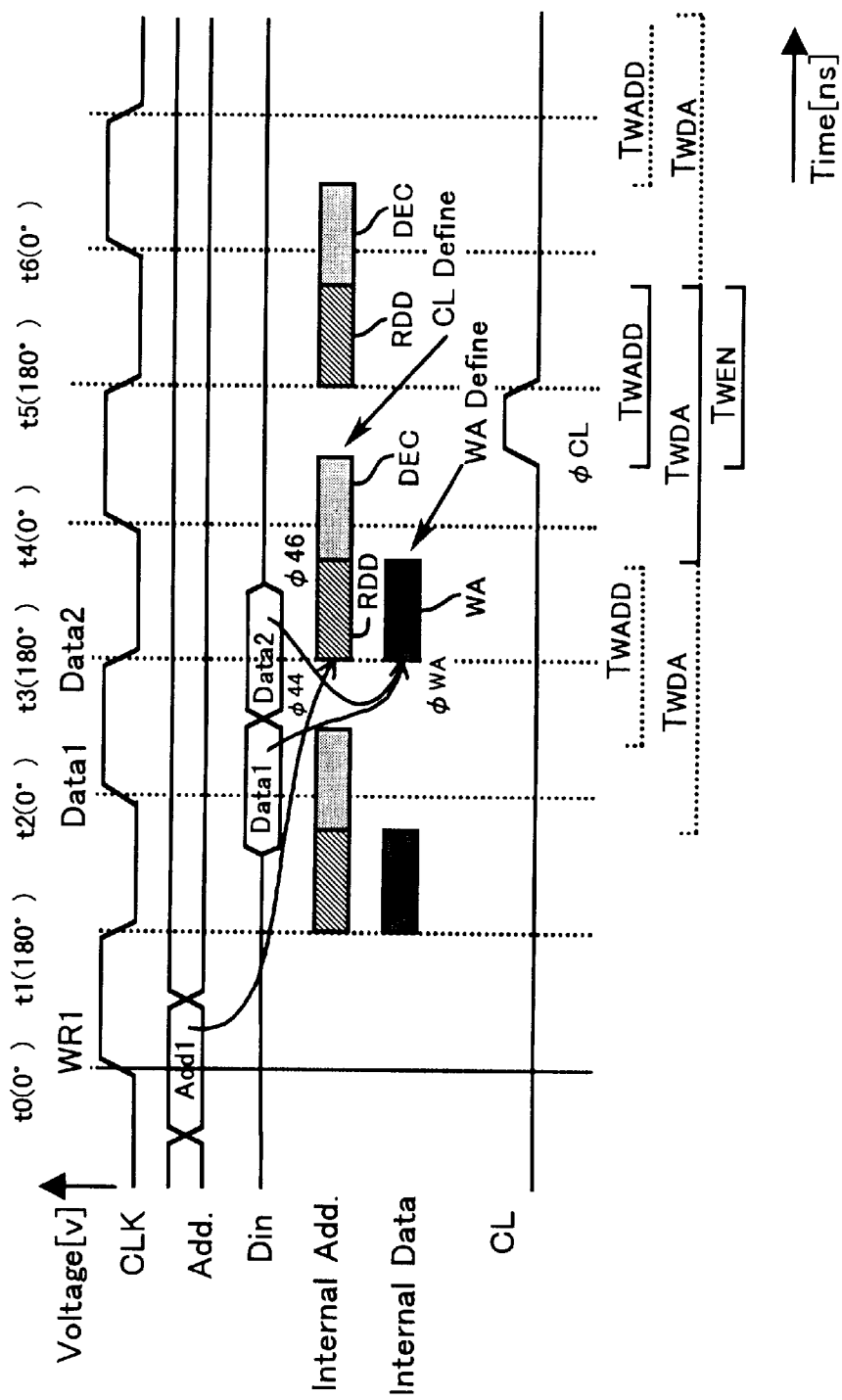
FIG. 17 is a timing chart showing problems in a conventional write mode.

FIG. 4 is a timing chart representing operations in the first embodiment aspect example. By comparing this with the conventional example in FIG. 17, the operations of this first embodiment aspect example become clear. In FIG. 4, a write command WR1 and an address Add1 are fetched in synchronization with the rising edge to (0°) of the clock signal CLK. The datum Data1 is fetched in synchronization with the rising edge t2, after one clock cycle period of the clock signal CLK, and, following that, the datum Data2 is fetched in synchronization with the falling edge t3 of the clock signal.

In the first embodiment aspect example, the redundancy checking circuits 146 and 246 start their redundancy checking operations RDD prior to the falling edge t3 of the clock signal where the last datum Data2 is fetched. In more specific terms, the redundancy checking circuits 146 and 246 perform their redundancy checking operations RDD after the rising edge t2 of the clock signal where the first datum Data1 is fetched. Accordingly, at the time of the falling edge t3 where the second datum Data2 is fetched, the redundancy checking operation RDD has already finished, therefore the decoder circuits 148 and 248 can begin their decoding operations DEC in synchronization with the falling edge t3.

The time period from the end of the decoder operation DEC and the end of the redundancy checking operation RDD in the next cycle is the address definition time $T_{WADD}$. In the first embodiment aspect example, the redundancy checking operation RDD is started earlier than in the conventional example, therefore the decoder operation DEC can also be started earlier than in the conventional example. Accordingly, this address defining time $T_{WADD}$ is shifted to an earlier time zone (on left side in drawing) than in the conventional example (cf. FIG. 17).

Meanwhile, the write amps 152 and 252 perform amplification operations based on the data, and the data definition time $T_{WDA}$ that defines the levels on the data bus DB, as conventionally, is the time period from the end of the write amp drive operation WA to the end of the write amp drive operation WA in the next cycle. Accordingly, as diagrammed in FIG. 4, the write enabled time $T_{WEN}$ wherein the address definition time $T_{WDDA}$ and the data definition time $T_{WDA}$ overlap is shifted to an earlier time, whereupon it is possible, by that margin, to speed up the column selection signal CL.

As described above, in the write mode, addresses are fetched simultaneously with the write command WR, after which a plurality of data is fetched after a clock period corresponding to the data latency. That being so, in the first embodiment aspect example, as diagrammed in FIG. 4, the redundancy checking operation RDD is performed prior to fetching the last datum, and the end of the decoder operation DEC and the end of the write amp drive operation WA are made compatible. As a result, it is possible to send the column selection signal CL high and perform a write operation to the memory cells immediately after data has been defined by the write amp. This is as indicated by the left-pointing arrows in FIG. 4.

Figure 5:
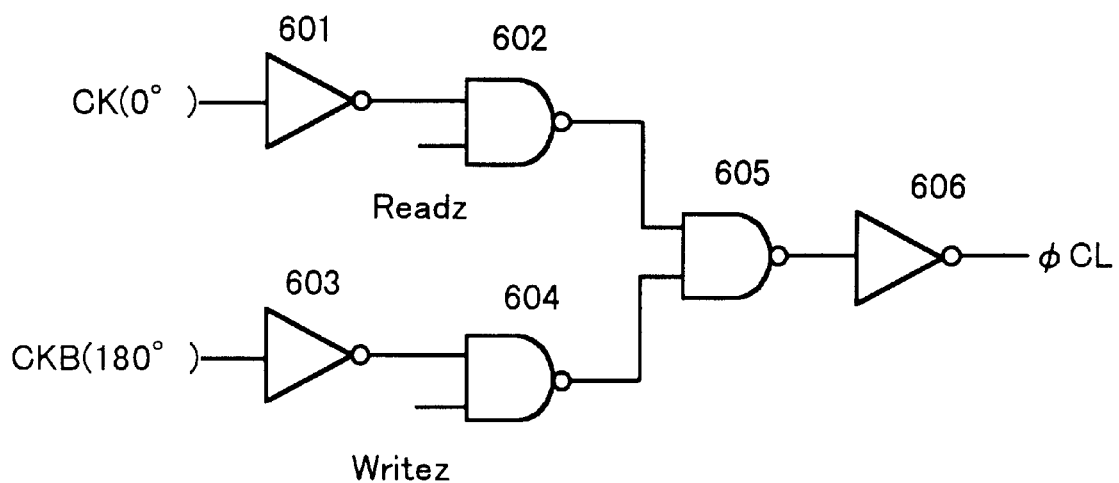
FIG. 5 is a diagram of a CL activating signal generator circuit 60.

FIG. 5 is a diagram of a CL activating signal generator circuit 60. To this CL activating signal circuit generator circuit are supplied a control signal Readz when in the read mode and a control signal Writez when in the write mode. When in the read mode, normally, a CL activating signal $\phi_{CL}$ that is a timing signal for raising the column selection signal CL to the high level is generated after a prescribed delay time following the timing of the rising edge (0°) of the clock signal where the read command RD is taken in. Accordingly, the clock signal CK synchronized to the rising edge of the clock signal at phase 0° is inverted by an inverter 601, and supplied together with the control signal Readz to a NAND gate 602. Accordingly, while the control signal Readz is at the high level H, the CL activating signal $\phi_{CL}$ is generated in response to the clock signal CK timing.

In the write mode, on the other hand, as diagrammed in FIG. 4, it is necessary to have the column selection signal CL generated in coordination with the end of the write amp WA operation that begins operating in synchronization with the falling edge t3 of the clock signal. That being so, the clock signal CKB synchronized with the rising edge of the clock signal at phase 180° is inverted by an inverter 603 and supplied together with the control signal Writez to a NAND gate 606. Accordingly, while the control signal Writez is at the H level, the CL activating signal $\phi_{CL}$ is generated in response to the timing of the clock signal CKB.

The control signals Readz and Writez are generated by a circuit (not shown) on the basis of output signals from the command decoder in FIG. 1.

(Second Embodiment Aspect Example)

Figure 6:
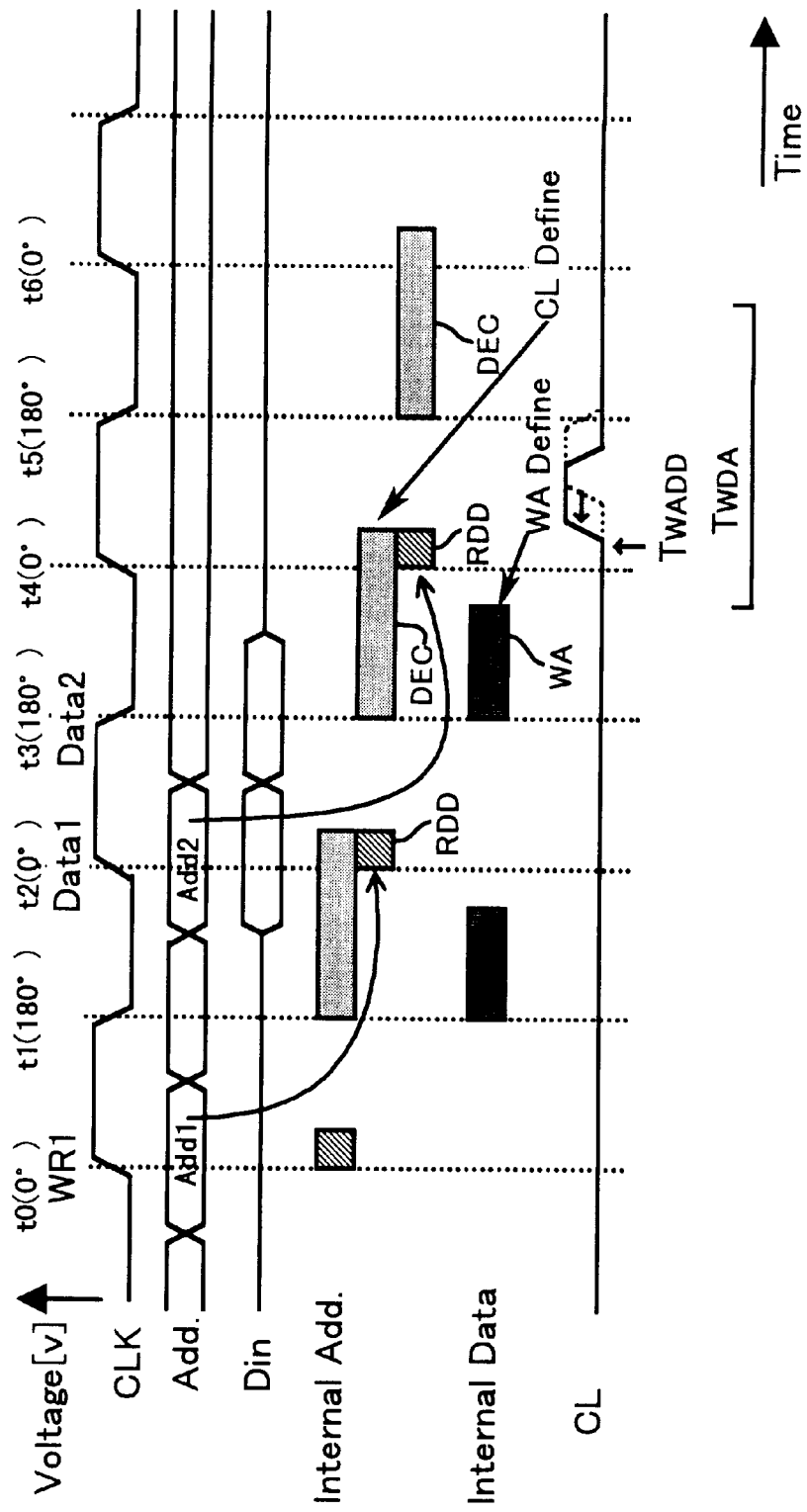
FIG. 6 is a timing chart for describing an improvement in the first embodiment aspect.

FIG. 6 is a timing chart for describing an improvement in the first embodiment aspect example described in the foregoing. Depending on the architecture of the memory device, the proportionality of the redundancy checking circuit operating time period and the decoder circuit decoding time period is variously altered. In the first embodiment aspect example diagrammed in FIG. 4, as indicated in that figure, the circuit architecture is established so that the redundancy checking operation RDD and the decoding operation DEC are performed in roughly equivalent operating periods. Accordingly, by starting the redundancy checking operation RDD at the rising edge t2 of the clock signal and starting the decoder operation DEC at the falling edge t3 of the clock signal, write operations can be performed normally and rapidly.

Nevertheless, in cases where the operating time for the decoding operation DEC becomes extremely long as compared to the redundancy checking operation RDD, the address defining time $T_{WADD}$ will disappear, as diagrammed in FIG. 6. More specifically, the redundancy checking operation RDD starts in synchronization with the rising edge t2 of the clock signal. This redundancy checking operation RDD finishes in a short time. After that, the decoding operation DEC starts in synchronization with the falling edge t3 of the clock signal. This decoding operation DEC, however, requires a long time as compared to the redundancy checking operation RDD. As a consequence, the decoding operation DEC cannot finish by the rising edge t4 of the clock signal. In the example diagrammed in FIG. 6, the end of the decoding operation DEC and the end of the redundancy checking operation RDD for the next address Add2 occur almost simultaneously. That being so, the address defining time $T_{WADD}$ from the end of the decoding operation DEC until immediately prior to the end of the next redundancy checking operation RDD, in the example in FIG. 6, becomes nearly zero.

In the first embodiment aspect example, as described in the foregoing, the redundancy checking operation RDD is started in synchronization with the rising edge t2 of the clock signal in order to speed up write operations. As a consequence, when the decoding operation DEC becomes longer, it will cease to be compatible with the next speeded-up redundancy checking operation RDD time period, whereupon it ceases to be possible to secure the address defining time $T_{WADD}$.

Thereupon, in the second embodiment aspect example, in order to cope with this kind of circuit architecture, the decoding operation DEC is performed following the end of the redundancy checking operation RDD. More specifically, the redundancy checking operation RDD is started in synchronization with the rising edge t2 of the clock signal and, following thereupon, the decoding operation DEC is performed. As a result, the problem of the address defining time $T_{WADD}$ disappearing, explained with FIG. 6, is eliminated.

Figure 7:
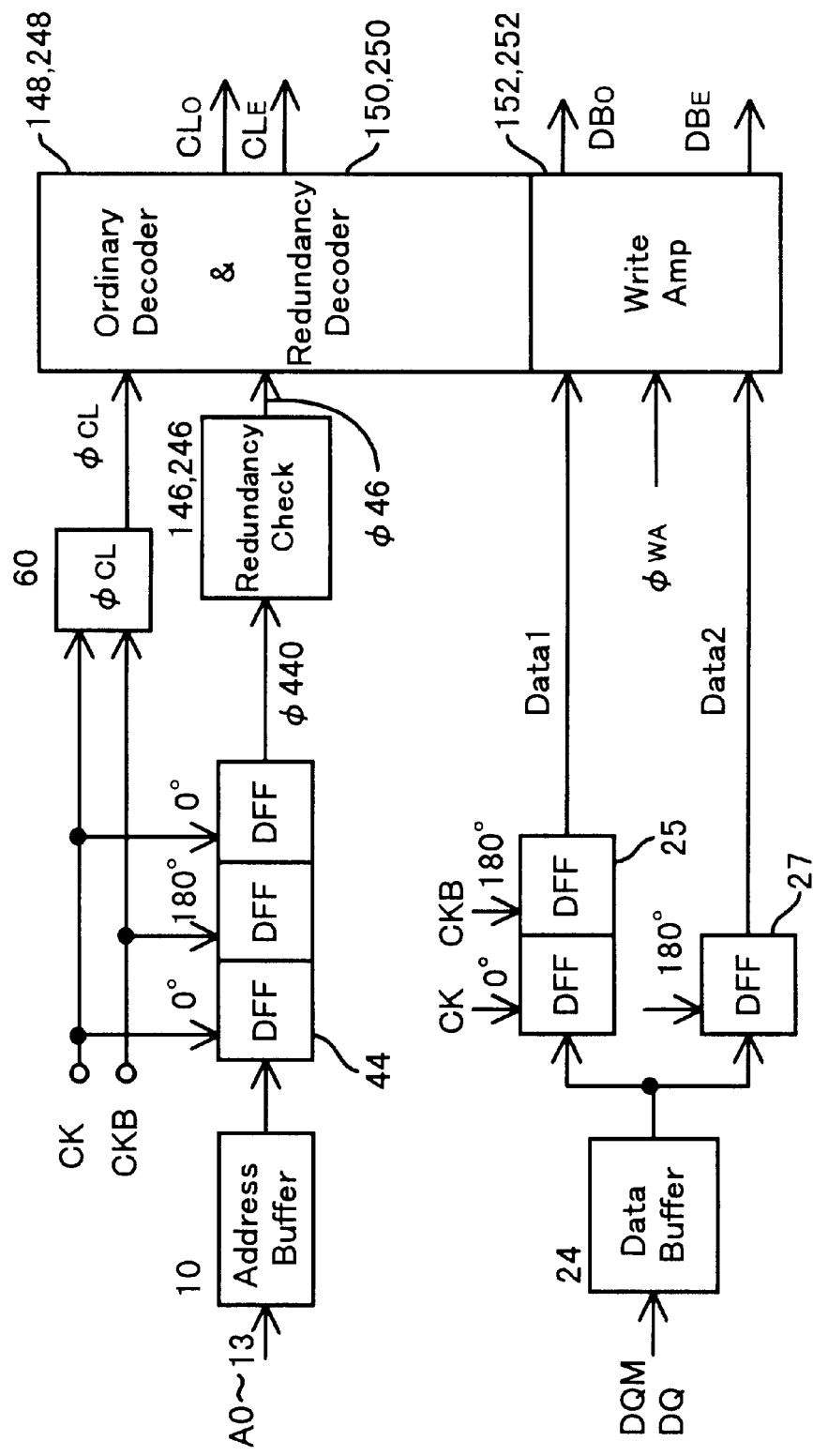
FIG. 7 is a configuration diagram of a memory device in a second embodiment aspect.
Figure 8:
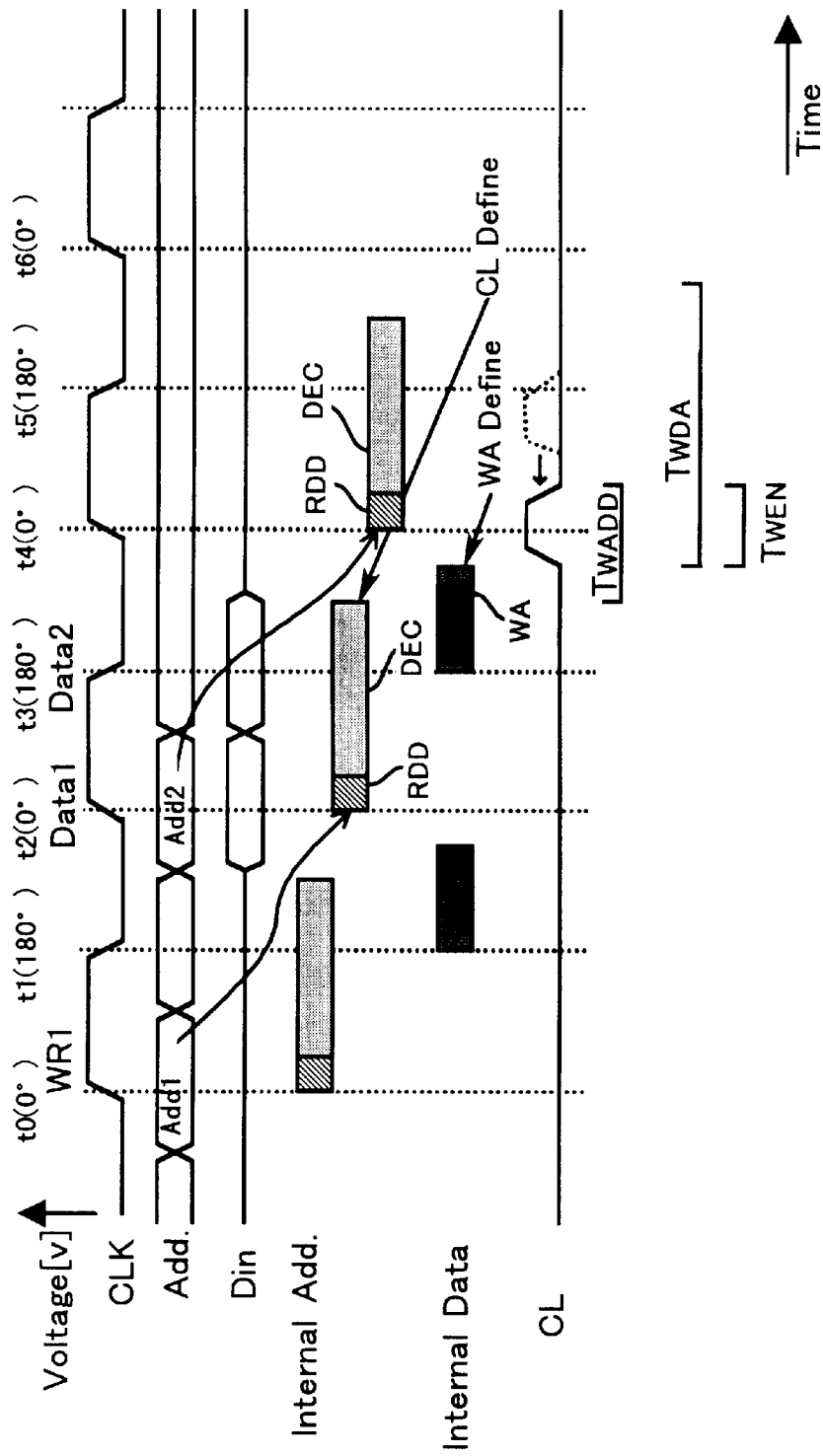
FIG. 8 is a timing chart representing the operation of the second embodiment aspect.

FIG. 7 is a configuration diagram of a memory device in the second embodiment aspect example. FIG. 8 is a timing chart for the operation thereof. In FIG. 7, the same designating numbers are used as in FIG. 3 for the first embodiment aspect example. As is apparent from a comparison with FIG. 3, in the second embodiment aspect example diagrammed in FIG. 7, addresses fetched by the address buffer 10 are sent to the delay circuit 44. Those addresses are supplied to the redundancy checking circuits 146 and 246 from the output ($\phi_{440}$) of the final-stage flip-flop fetching in synchronization with the rising edge t2 for which the phase is 0°. Then, in response to the coincidence/non-coincidence detection signal that is one of the output ($\phi_{46}$) of the redundancy checking circuits 146 and 246, the decoder circuits 148 and 248 begin operating. The operation on the data side is the same as in the first embodiment aspect example.

As represented in the operation timing chart in FIG. 8, the address Add1 fetched together with the write command WR in synchronization with the rising edge t0 of the clock signal is supplied to the redundancy checking circuits 146 and 246 in synchronization with the rising edge t2 of the clock signal prior to fetching the second datum Data2. Accordingly, the redundancy checking operation RDD starts in synchronization with the rising edge t2. The redundancy checking operation period RDD is comparatively short, and, following that operation, the decoding operations DEC of the decoder circuits 148 and 248 and the redundant decoder circuits 150 and 250 are performed. These decoder operations DEC are comparatively long. However, by performing the redundancy checking operation RDD and the decoding operation DEC continuously, the address defining time $T_{WADD}$ from the end of the decoder operation DEC until the end of the redundancy checking operation RDD in the next cycle can be secured, as indicated in FIG. 8.

The operations on the data side, on the other hand, are performed in synchronization with the falling edge t3 of the clock signal where the last datum is fetched, as in the first embodiment aspect example. Accordingly, the write enabled time $T_{WEN}$ where the data definition time $T_{WDA}$ and the address definition time $T_{WADD}$ overlap can be secured. Also, the redundancy checking operation RDD begins prior to fetching the last datum, as in the first embodiment aspect example, therefore it is possible to speed up the timing wherewith the column selection signal CL is supplied after defining the address and data.

(Third Embodiment Aspect Example)

Figure 9:
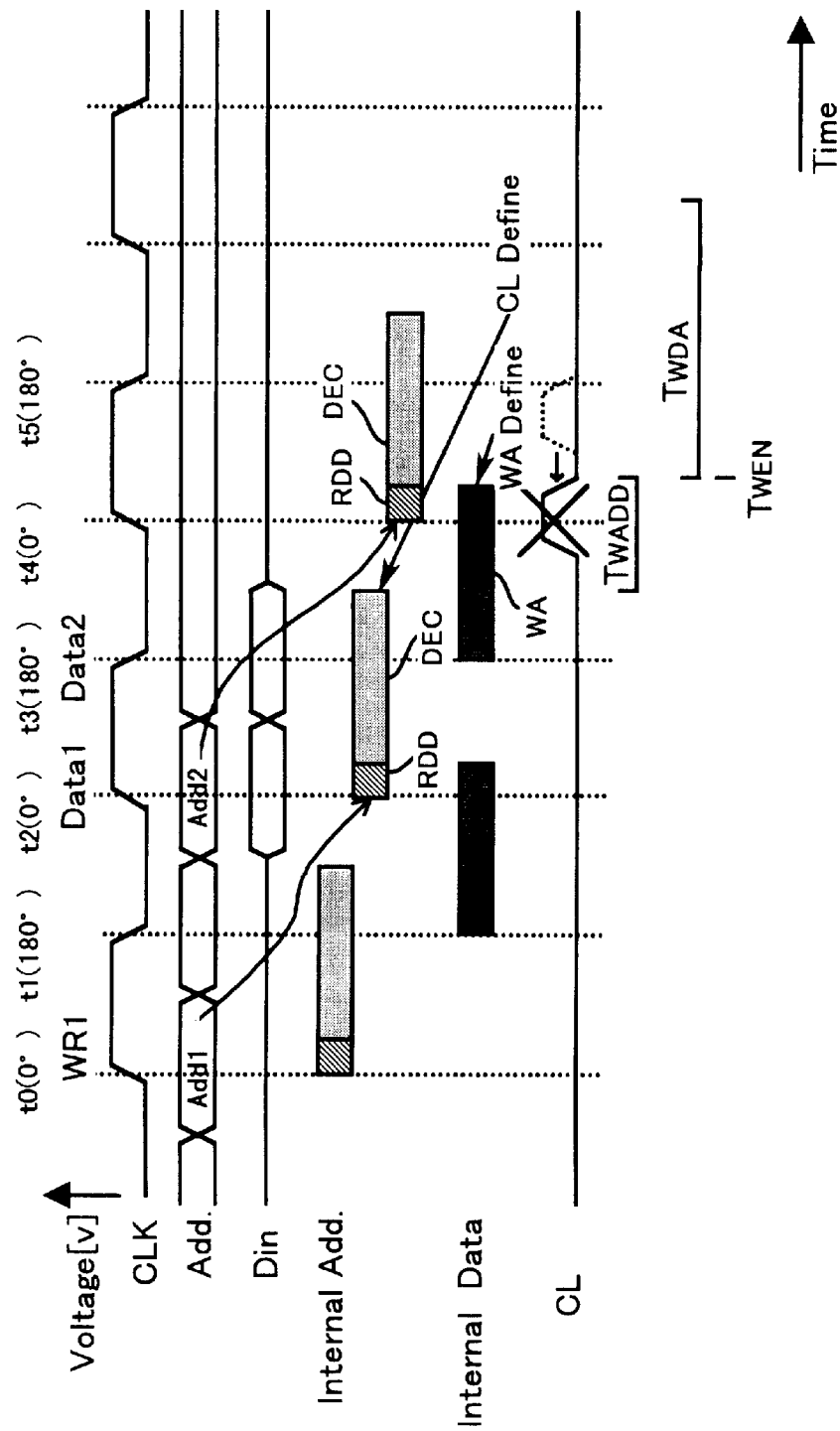
FIG. 9 is a timing chart for describing an improvement in the second embodiment aspect.

FIG. 9 is a timing chart for describing an improvement in the second embodiment aspect example. When a faster clock, i.e. a high-frequency clock, is employed, there are cases where the write enable time $T_{WEN}$ cannot be secured by the method in the second embodiment aspect example wherein the redundancy checking operation RDD and the decoding operation DEC are performed continuously from the falling edge t2 of the clock signal. The reason is as follows. In the second embodiment aspect example, the redundancy checking operation RDD and the decoding operation DEC are performed continuously in synchronization with the rising edge t2 of the clock signal prior to fetching the second datum. Meanwhile, the write amp operation WA is performed in synchronization with the falling edge t3 of the clock signal where the second datum is fetched. In this case, if the clock frequency becomes higher, the clock period will shorten, and the time wherein the address defining time $T_{WADD}$ and the data defining time $T_{WDA}$ overlap disappears. In other words, when the clock frequency becomes shorter, the redundancy checking operation RDD for the address in the next cycle ends before the write amp operation WA finishes. As a consequence, the write enable time $T_{WEN}$ can no longer be secured.

The problem described above becomes pronounced in a memory device having circuit architecture wherein the time period from the falling edge t3 of the clock signal to the conclusion of the write amp operation becomes long. Such architecture is encountered, for example, in cases where, as a result of adopting a circuit configuration where high-speed read operation is higher priority, the write amp operation time becomes long, without the circuit configuration being optimized in the write system.

In the first and second embodiment aspect examples, write operations are made high-speed by starting the redundancy checking operation prior to fetching the last datum. However, in a memory device wherein the write system circuitry is slow, in order to secure the write enable time $T_{WEN}$ when the clock frequency shortens in conjunction with the faster clock speed, it becomes necessary to coordinate the end of the decoding operation DEC and the end of the write amp operation WA with the same timing.

Figure 10:
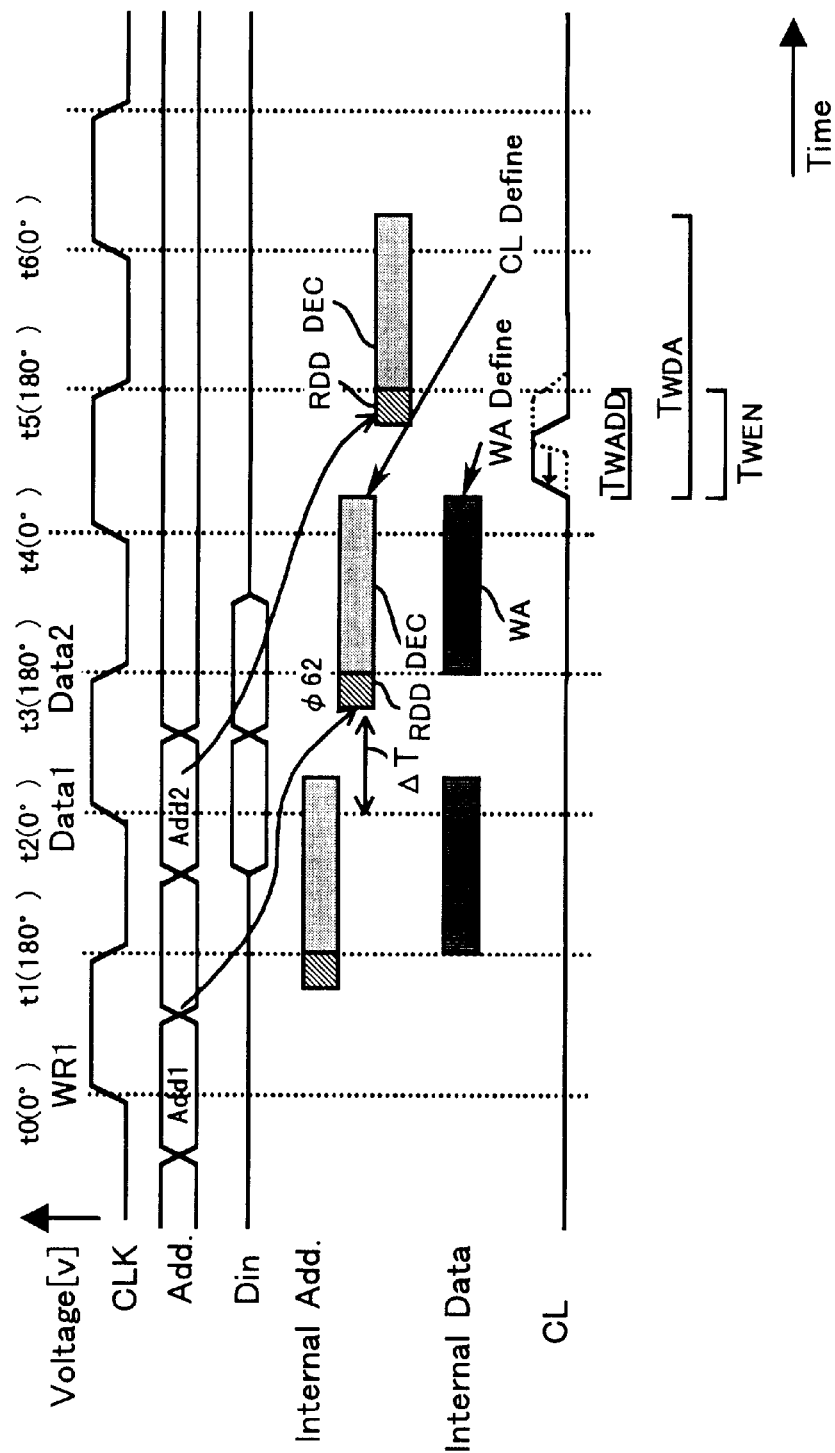
FIG. 10 is a timing chart of the operation in a third embodiment aspect.

FIG. 10 is a timing chart for the operation of the third embodiment aspect example. What is characteristic of this third embodiment aspect example is that, while the redundancy checking operation RDD and the decoding operation DEC are performed continuously, the start of the redundancy checking operation RDD is made a prescribed time $\Delta T$ after the rising edge t2 of the clock signal. It is preferable that this prescribed time $\Delta T$ be set so that both the decoding operation DEC and the write amp operation WA will end nearly simultaneously when the clock used is operating at the highest frequency. Alternatively, the prescribed time $\Delta T$ is set so that the decoding operation DEC and the write amp operation WA end nearly simultaneously at the clock frequency used.

By delaying the timing of the start of the redundancy checking operation RDD by the prescribed time $\Delta T$, at the time where the write amp operation WA ends, the redundancy checking operation RDD in the next cycle will not have ended, whereupon a time period can be secured where the address defining time $T_{WADD}$ and the data defining time $T_{WDA}$ overlap. Moreover, by coordinating the timing of the end of the decoding operation DEC at least with the end of the write amp operation WA, the write timing that sends the column selection signal CL high can be made faster than in the conventional example.

Figure 11:
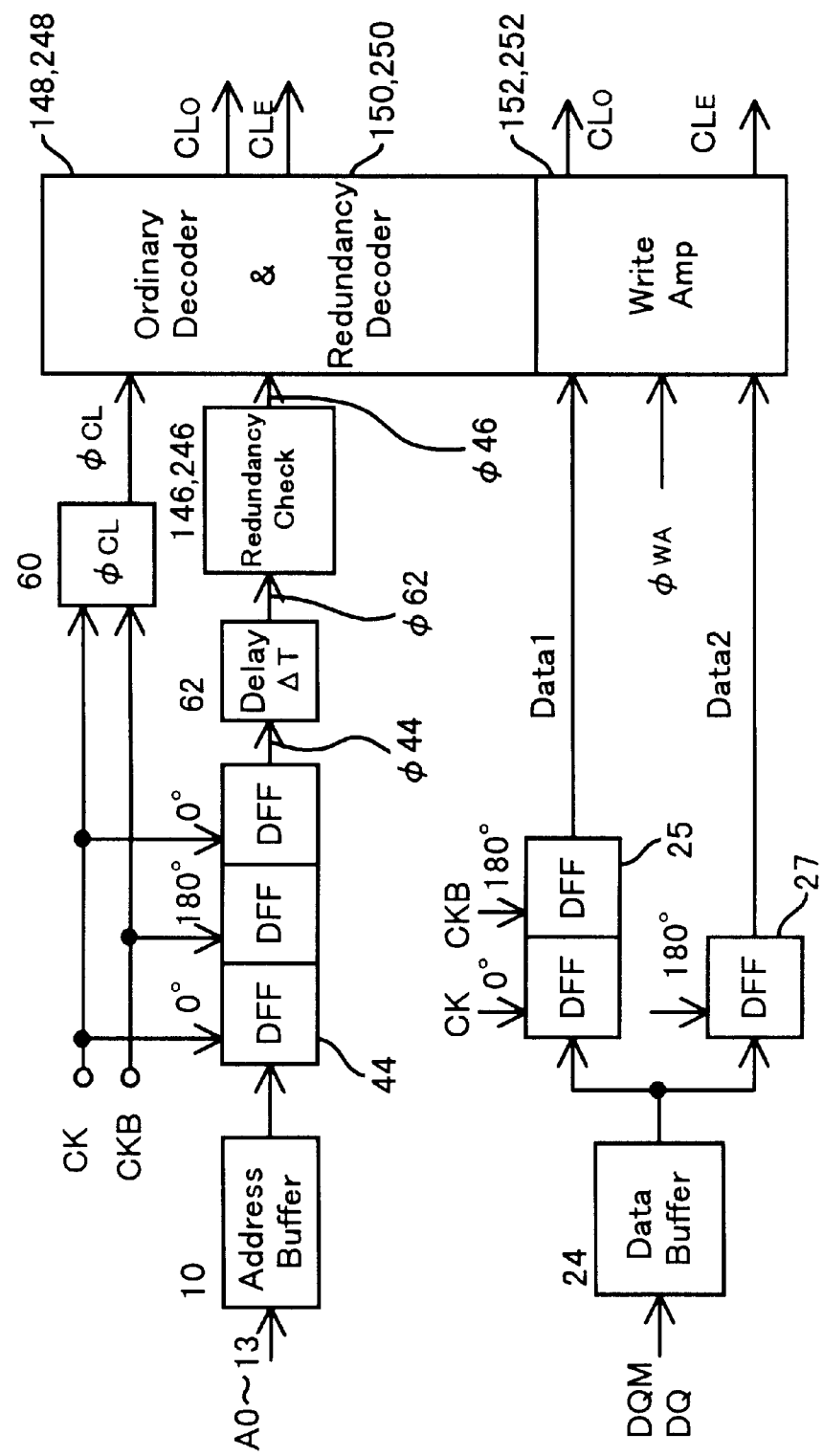
FIG. 11 is a configuration diagram for the memory device in the third embodiment aspect.

FIG. 11 is a simplified configuration diagram for a memory device in the third embodiment aspect example. The same numbers as in FIGS. 3 and 7 are used here to designate corresponding components. As is clear from FIG. 11, a delay circuit 62 is placed between the delay circuit 44 and the redundancy checking circuits 146 and 246 for the purpose of delaying the redundancy checking operation by the prescribed time $\Delta T$ after the rising edge (0°) of the clock signal. According the final-stage flip-flop of the delay circuit 44 outputs the output $\phi_{44}$ in synchronization with the rising edge t2 of the clock signal, and, after the prescribed time $\Delta T$ thereafter, the delay circuit 62 output $\phi_{62}$ is supplied as the address to the redundancy checking circuits 146 and 246.

Figure 12:
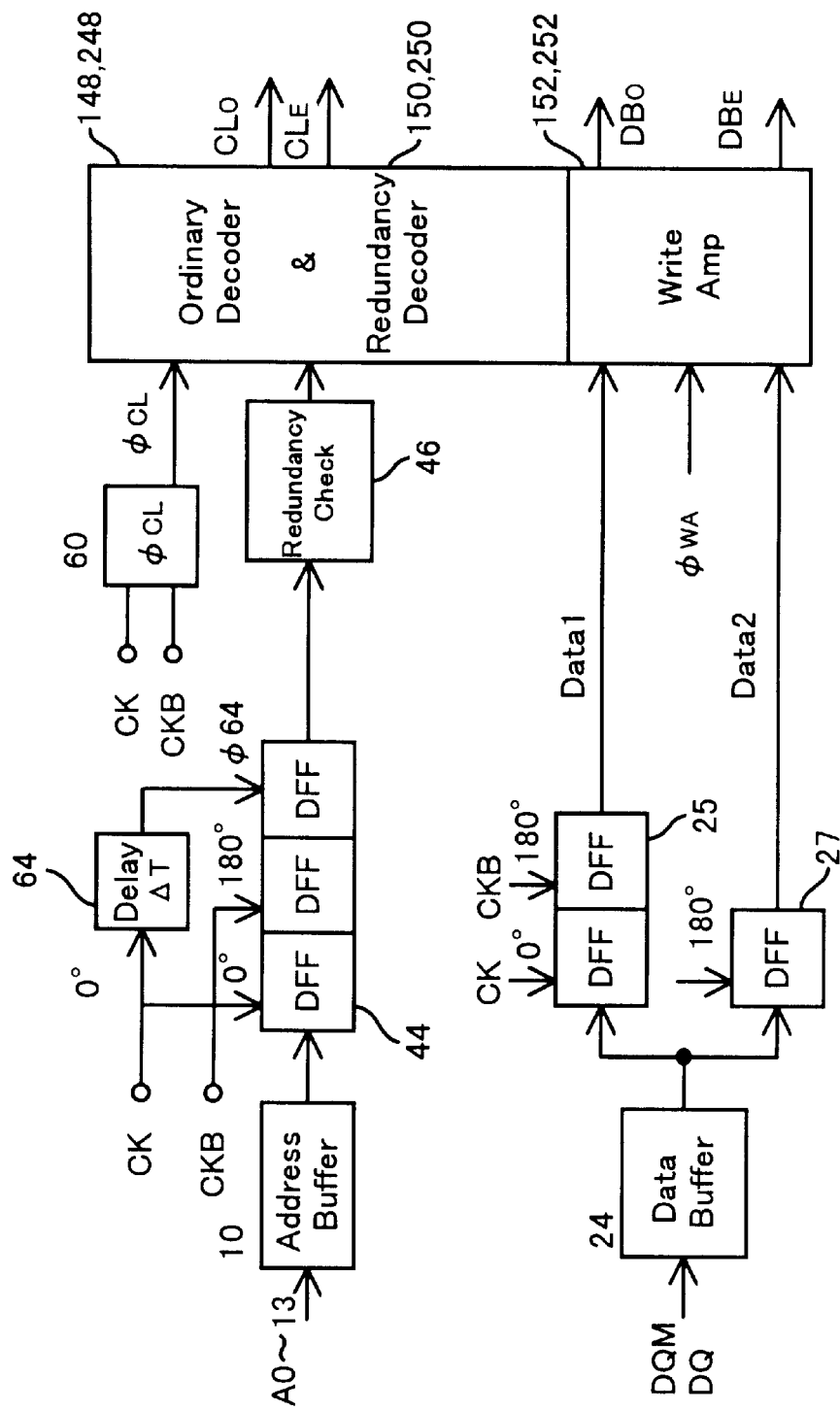
FIG. 12 is a configuration diagram for the memory device in the third embodiment aspect.

FIG. 12 is a configuration diagram for another memory device in the third embodiment aspect example. The address signal extends to a number of bits, wherefore providing the delay circuit 62 for all of those address signals will lead to a larger sized circuit. That being so, in the example diagrammed in FIG. 12, the clock signal CK synchronized with the rising edge (0°) of the clock signal is delayed by the prescribed time $\Delta T$ via a delay circuit 64, and the final-stage flip-flop of the delay circuit 44 is controlled by that delayed control clock signal $\phi_{64}$. Accordingly, the delay circuit 64 need only be formed commonly for the plurality of addresses, whereupon no increase in circuit size is needed.

Figure 13:
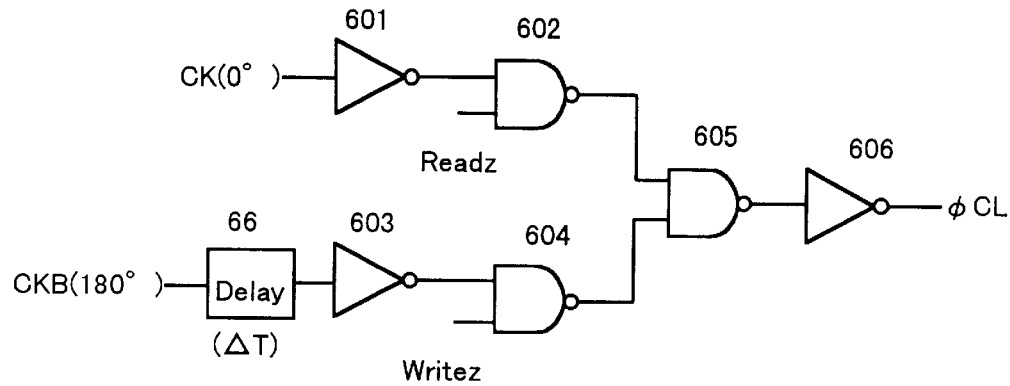
FIG. 13 is a schematic diagram of a CL activating signal generator circuit in the third embodiment aspect.

FIG. 13 is a schematic diagram of a CL activating signal generator circuit in the third embodiment aspect example. The same numbers as in FIG. 5 are used for designating corresponding components. As was described with reference to FIG. 5, the timing with which the CL activating signal $\phi_{CL}$ is generated differs between the read mode and the write mode. In the third embodiment aspect example, the redundancy checking operation RDD and decoding operation DEC are performed after a prescribed delay ΔT from the rising edge t2 of the clock signal. That being so, inside the CL activating signal generator circuit 60 also, in like manner, the clock signal CKB synchronized with the falling edge (180°) of the clock signal is delayed ΔT by the delay circuit 66 and then supplied to the inverter 603. Accordingly, the column selection signal CL that determines write timing is generated at timing that begins at the falling edge t3 (180°) delayed one and half clock cycle period after taking in the write command WR with taking the prescribed time ΔT into consideration.

Figure 14:
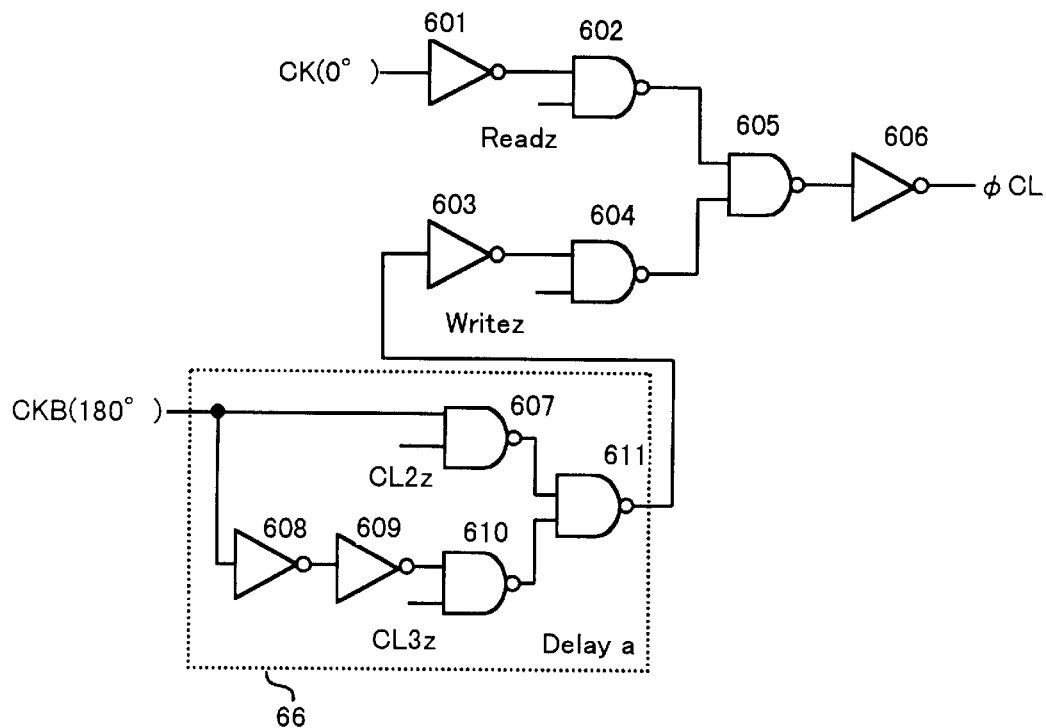
FIG. 14 is a schematic diagram of a CL activating signal generator circuit based on an improved example of the third embodiment aspect.

FIG. 14 is a schematic diagram of a CL activating signal generator circuit based on an improvement in the third embodiment aspect example. In this modified example, whether to delay, not to delay, or how much to delay the redundancy checking operation RDD by the prescribed time ΔT is set differently according to the frequency of the supplied clock signal. More specifically, when a high-frequency clock signal is used, as described in the third embodiment aspect example above, it is necessary to delay the redundancy checking operation RDD by the prescribed time ΔT. However, when the clock frequency is low, the delay by that prescribed time ΔT becomes unnecessary. Accordingly, in this modified example, when the clock frequency is high, the prescribed time ΔT is made longer, and when the clock frequency is low, the prescribed time ΔT is made shorter or zero.

Figure 15:
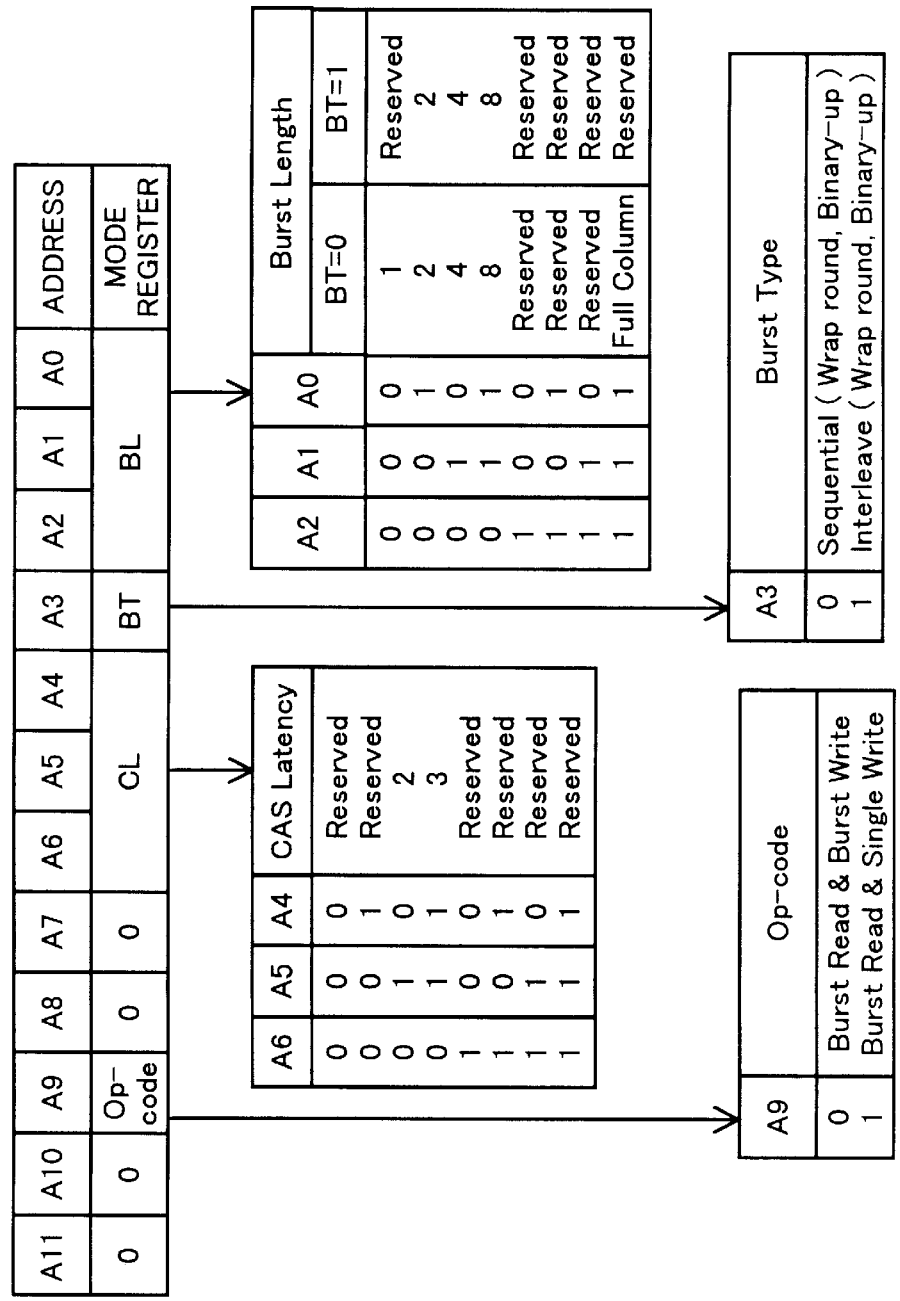
FIG. 15 is a diagram for describing mode register settings in an SDRAM.

The frequency of the supplied clock signal can be determined by the value set in the mode register 20 (see FIG. 1). FIG. 15 is a diagram for describing mode register settings in an SDRAM. When the power is turned on, the command decoder detects a mode register set command according to a combination of command signals. At that time, numerical values like those in FIG. 15 are set in the address terminals A0–A11. One of these setting values is CAS latency CL. CAS latency is the number of clock pulses required from the time a read command is taken in until the time that the read data are output. When a high-speed clock is used, the clock signal cycle period will be short compared to the internal circuit operation, wherefore the CAS latency CL will increase. Accordingly, whether the frequency of the supplied clock signal is high or low can be determined on the basis of the CAS latency CL provided from the memory controller.

In the circuit example diagrammed in FIG. 14, when the CAS latency is 2, the level of the control signal CL2z will be high, and a delay time ΔT corresponding to the low-speed clock signal will be generated by the delay circuit 66. When the CAS latency is 3, the level of the control signal CL3z will be high, and a long delay time ΔT corresponding to the high-speed clock will be generated by the two-stage inverters 608 and 609 of the delay circuit 66. As diagrammed in FIG. 1, these control signals CL2z and CL3z are generated from the mode register 20 wherein the setting values noted above are stored.

As described in the foregoing, when the delay time ΔT setting is altered to accord with the supplied clock signal frequency, the delay signal ΔT in the delay circuit 62 of FIG. 11 and the delay circuit 64 in FIG. 12 should also be set with altered values.

As based on this invention, described in the foregoing, it is possible to reduce the delay of the write operation due to fetching a plurality of data in a memory device having a multiple-bit data pre-fetch function. In particular, in cases where data are supplied at a double data rate, write operations can be speeded up according to the present invention, which is ideal for the high-speed memory devices. Also, an optimal write enable time can be secured even with a high-frequency clock signal. In addition, an optimal write enable time can be secured, while realizing high-speed write operations, in various kinds of circuit architecture.

What is claimed is:

1. A memory device wherein, for one address, a plurality of data is fetched in synchronization with a first and a second edge of a clock signal, and said plurality of data is written to memory cells via a write amp; comprising:

an ordinary cell array and a redundant cell array both having said memory cells;

a redundancy checking circuit for comparing said address with redundant address and checking coincidence or non-coincidence thereof; and a decoder circuit for decoding said address and for selecting said memory cells either in said ordinary cell array or in said redundant cell array in response to coincidence or non-coincidence determined by said redundancy checking circuit;

wherein said redundancy checking circuit begins said redundancy checking operation before the last data of the plurality of data is fetched.

2. The memory device according to claim 1, wherein: said redundancy checking circuit performs said redundancy checking operation in response to said first edge prior to said second edge where said write amp begins operating; and said decoder circuit performs said decoding operation in response to said second edge.

3. The memory device according to claim 1, wherein: said redundancy checking circuit performs said redundancy checking operation in response to said first edge prior to said second edge where said write amp begins operating; and said decoder circuit performs said decoding operation following said redundancy checking operation of said redundancy checking circuit.

4. The memory device according to claim 1, wherein said decoder circuit performs said decoding operation before said write amp starts the operation in response to said second edge.

5. The memory device according to claim 1, wherein said decoder circuit performs said decoding operation following said redundancy checking operation of said redundancy checking circuit.

6. The memory device according to claim 5, wherein said redundancy checking circuit performs said redundancy checking operation after a prescribed delay time after said first edge prior to said second edge where said write amp begins operating.

7. The memory device according to claim 6, wherein said prescribed delay time is set so that, when said clock signal is at highest frequency, timing of selection operation of said decoder circuit and timing of data supply operation of said write amp roughly coincide.

8. The memory device according to claim 6, wherein said prescribed delay time is set at a first delay time when said clock signal is at a first frequency, and is set at a second delay time longer than said first delay time when said clock signal is at a second frequency higher than said first frequency.

9. The memory device according to claim 1, wherein:

said redundancy checking circuit performs said redundancy checking operation at a prescribed delay time after said first edge prior to said second edge where said write amp begins operating; said decoder circuit performs said decoding operation following said redundancy checking operation;

said plurality of data is fetched continuously in response to said first edge after a data latency, after input of a write command instructing a write operation, last datum of said plurality of data is fetched in response to said second edge, and selection of said memory cells is activated after a first prescribed time after timing of said second edge;

selection of said memory cells is activated after a second prescribed time after timing of said first edge of said clock signal where read command instructing a read operation was input;

and said first prescribed time has a length corresponding to said prescribed delay time.

10. The memory device according to any one of claims 1–9, 9, wherein said plurality of data consists of two data.

11. A memory device wherein, for one address, first and second data are fetched in synchronization with a rising edge and a falling edge of a clock signal, respectively, and the first and second data are written to memory cells via a write amp; comprising:

an ordinary cell array and a redundant cell array both having said memory cells;

a redundancy checking circuit for comparing said address with redundant address and checking coincidence or non-coincidence thereof; and a decoder circuit for decoding said address and for selecting said memory cells either in said ordinary cell array or in said redundant cell array in response to coincidence or non-coincidence determined by said redundancy checking circuit;

wherein said redundancy checking circuit begins said redundancy checking operation before said second data is fetched.

12. The memory device according to claim 11, wherein: said redundancy checking circuit performs said redundancy checking operation in response to said rising edge where said first datum is fetched; and said decoder circuit performs said decoding operation in response to said falling edge.

13. The memory device according to claim 11, wherein: said redundancy checking circuit performs said redundancy checking operation in response to said rising edge where said first datum is fetched; and said decoder circuit performs said decoding operation following said redundancy checking operation of said redundancy checking circuit.

14. The memory device according to claim 11, wherein: said redundancy checking circuit performs said redundancy checking operation after a prescribed delay time after said rising edge where said first datum is fetched; and said decoder circuit performs said decoding operation following said redundancy checking operation of said redundancy checking circuit.

* * * * *